(12) United States Patent
Lin

(10) Patent No.: US 11,387,262 B2
(45) Date of Patent: Jul. 12, 2022

(54) DISPLAY PANEL AND DISPLAY DEVICE

(71) Applicants: HKC CORPORATION LIMITED, Shenzhen (CN); CHONGQING HKC OPTOELECTRONICS TECHNOLOGY CO., LTD., Chongqing (CN)

(72) Inventor: Jia-Ren Lin, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 749 days.

(21) Appl. No.: 16/319,490

(22) PCT Filed: Nov. 21, 2018

(86) PCT No.: PCT/CN2018/116613
§ 371 (c)(1),
(2) Date: Jan. 22, 2019

(87) PCT Pub. No.: WO2020/093455
PCT Pub. Date: May 14, 2020

(65) Prior Publication Data
US 2021/0358954 A1 Nov. 18, 2021

(30) Foreign Application Priority Data
Nov. 6, 2018 (CN) .......................... 201821821347.2

(51) Int. Cl.
*H01L 27/12* (2006.01)

(52) U.S. Cl.
CPC ........ *H01L 27/124* (2013.01); *H01L 27/1218* (2013.01)

(58) Field of Classification Search
CPC ............... H01L 27/124; H01L 27/1218; H01L 51/5203; H01L 51/0096; H01L 27/1108; H01L 51/5296; H01L 51/0023; H01L 27/3265; H01L 29/78648; H01L 27/1288; H01L 27/1248; H01L 29/41733; H01L 27/14658; H01L 29/7869; H01L 29/24;
(Continued)

(56) References Cited

U.S. PATENT DOCUMENTS 6,532,050 B1 * 3/2003 Kim .................. G02F 1/133514
349/106
6,746,905 B1 * 6/2004 Fukuda ................... H01L 27/12
257/E21.413
(Continued)

FOREIGN PATENT DOCUMENTS

CN 202585418 U 12/2012
CN 202794782 U 3/2013
(Continued)

OTHER PUBLICATIONS

Yuanfeng Fang, the ISA written comments, Jul. 2019, CN.

*Primary Examiner* — Mouloucoulaye Inoussa

(57) ABSTRACT

This application discloses a display panel and a display device. The display panel includes a first metal layer, an insulation layer is formed on the first metal layer, a second metal layer is formed on the insulation layer, and a width of the first metal layer is different from a width of the second metal layer.

20 Claims, 3 Drawing Sheets

(58) Field of Classification Search
CPC .............. H01L 31/028; H01L 31/0203; H01L
31/022466; H01L 27/14612; H01L
27/14689; H01L 27/14636; H01L
29/66969; H01L 31/202; H01L 29/78603;
H01L 29/78645; H01L 27/3276; H01L
27/3262; H01L 27/3258; H01L 27/3248;
H01L 29/66757; H01L 29/78675; Y02P
70/50; Y02E 10/549; G02F 1/1368; G02F
1/136286; H05K 1/0296
USPC .......... 257/43, 72, 40; 438/104, 157, 59, 23;
345/87
See application file for complete search history.

(56) References Cited

U.S. PATENT DOCUMENTS

| | | | |
|---|---|---|---|
| 9,570,620 B2* | 2/2017 | Ge | G02F 1/1368 |
| 2003/0025166 A1* | 2/2003 | Yamazaki | H01L 29/78696 |
| | | | 257/397 |
| 2005/0121677 A1* | 6/2005 | Kim | H01L 28/40 |
| | | | 257/72 |
| 2008/0121890 A1* | 5/2008 | Yang | H01L 27/1288 |
| | | | 257/66 |
| 2008/0128664 A1* | 6/2008 | Kitae | H01L 24/32 |
| | | | 252/512 |
| 2008/0239183 A1* | 10/2008 | Luo | G02F 1/136213 |
| | | | 349/39 |
| 2010/0025690 A1 | 2/2010 | Kim et al. | |
| 2011/0273397 A1* | 11/2011 | Hanari | G09G 3/3233 |
| | | | 345/174 |
| 2012/0161136 A1* | 6/2012 | Yen | H01L 27/124 |
| | | | 257/59 |
| 2013/0082252 A1* | 4/2013 | Yamazaki | H01L 29/66969 |
| | | | 257/43 |
| 2013/0270527 A1* | 10/2013 | Kwon | H01L 27/3265 |
| | | | 257/40 |
| 2014/0061606 A1* | 3/2014 | Kim | H01L 23/48 |
| | | | 257/40 |
| 2014/0217410 A1* | 8/2014 | Hsu | H01L 21/845 |
| | | | 257/59 |
| 2014/0332768 A1* | 11/2014 | Kwon | H01L 27/124 |
| | | | 257/40 |
| 2015/0009438 A1* | 1/2015 | Du | H05K 1/025 |
| | | | 349/42 |
| 2015/0144952 A1* | 5/2015 | Kim | H01L 27/3276 |
| | | | 257/72 |
| 2015/0153599 A1* | 6/2015 | Yamazaki | H01L 27/1225 |
| | | | 257/43 |
| 2015/0187860 A1* | 7/2015 | Seo | H01L 29/78633 |
| | | | 257/40 |
| 2015/0221678 A1* | 8/2015 | Yamazaki | H01L 27/14609 |
| | | | 257/43 |
| 2015/0221679 A1* | 8/2015 | Yamazaki | H01L 29/42384 |
| | | | 257/43 |
| 2015/0221775 A1* | 8/2015 | Yamazaki | H01L 27/1225 |
| | | | 257/43 |
| 2015/0270327 A1* | 9/2015 | Oh | H01L 27/3223 |
| | | | 257/40 |
| 2015/0325705 A1* | 11/2015 | Choi | G02F 1/1368 |
| | | | 257/72 |
| 2016/0013243 A1* | 1/2016 | O'Rourke | H01L 31/028 |
| | | | 257/43 |
| 2016/0126256 A1* | 5/2016 | Hwang | H01L 27/124 |
| | | | 257/72 |
| 2016/0141308 A1* | 5/2016 | Umezaki | G09G 3/3266 |
| | | | 349/43 |
| 2016/0190224 A1* | 6/2016 | Kim | H01L 27/3265 |
| | | | 257/40 |
| 2016/0351586 A1* | 12/2016 | Seo | H01L 24/73 |
| 2017/0139296 A1 | 5/2017 | Kimoto et al. | |
| 2018/0069190 A1* | 3/2018 | Kim | H01L 27/1108 |
| 2018/0123088 A1* | 5/2018 | Kim | H01L 51/0012 |
| 2020/0395428 A1* | 12/2020 | Baek | H01L 27/3276 |

FOREIGN PATENT DOCUMENTS

| | | |
|---|---|---|
| CN | 103149753 A | 6/2013 |
| CN | 103399434 A | 11/2013 |

* cited by examiner

DISPLAY PANEL AND DISPLAY DEVICE

This application claims priority to Chinese Patent Application No. CN201821821347.2, filed with the Chinese Patent Office on Nov. 6, 2018, and entitled "DISPLAY PANEL AND DISPLAY DEVICE", which is incorporated herein by reference in its entirety.

TECHNICAL FIELD

This application relates to the field of display technologies, and in particular, to a display panel and a display device.

BACKGROUND

The description herein provides only background information related to this application, but does not necessarily constitute the existing technology.

With the development and advancement of science and technologies, flat-panel displays become mainstream products of displays and are widely applied contributing to hotspot features such as thinness, power saving and low radiation. The flat-panel display includes a thin film transistor-liquid crystal display (TFT-LCD), an organic light-emitting diode (OLED) display, and the like. The TFT-LCD controls rotation directions of liquid crystal molecules and refracts out light of a backlight module to generate an image, and has many advantages such as thinness, power saving and no radiation.

In a panel structure, double-layer cables are used in an edge area to reduce cabling impedance, and generally, during product design, peripheral cabling uses a design that two cables are trimmed. A passivation protective layer has poor covering performance, which easily causes corrosion on the metal layer.

SUMMARY

An objective of this application is to provide a display panel and a display device, to improve the corrosion resistance of the metal layer.

To achieve the foregoing objective, this application provides a display panel. The display panel comprises a substrate, wherein a first metal layer is formed on the substrate, an insulation layer is formed on the first metal layer, a second metal layer is formed on the insulation layer, and a passivation protective layer is formed on the second metal layer; widths of bottoms of the first metal layer and the second metal layer are greater than widths of tops, widths of the first metal layer and the second metal layer gradually increase from the tops to the bottoms; and a width of the first metal layer is different from a width of the second metal layer.

Optionally, the width of the second metal layer is greater than the width of the first metal layer.

Optionally, the width of the top of the second metal layer is the same as the width of the top of the first metal layer.

Optionally, the width of the second metal layer is greater than a width of the insulation layer covering the first metal layer.

Optionally, a side of the second metal layer is step-shaped.

Optionally, the width of the first metal layer is greater than the width of the second metal layer.

Optionally, a difference between the width of the first metal layer and the width of the second metal layer is less than or equal to 100 microns.

Optionally, a thickness of the passivation protective layer is greater than 3000 angstroms.

This application further discloses a display panel. The display panel comprises a substrate, a first metal layer is formed on the substrate, an insulation layer is formed on the first metal layer, a second metal layer is formed on the insulation layer, and a passivation protective layer is formed on the second metal layer; widths of bottoms of the first metal layer and the second metal layer are greater than widths of tops, the widths of the first metal layer and the second metal layer gradually increase from the tops to the bottoms; and a width of the first metal layer is different from a width of the second metal layer; the width of the second metal layer is greater than the width of the first metal layer; the width of the second metal layer is greater than a width of the insulation layer covering the first metal layer; and a side of the second metal layer is step-shaped.

This application further provides a display device. The display device comprises a display panel. The display panel comprises a substrate, wherein a first metal layer is formed on the substrate, an insulation layer is formed on the first metal layer, a second metal layer is formed on the insulation layer, and a passivation protective layer is formed on the second metal layer; widths of bottoms of the first metal layer and the second metal layer are greater than widths of tops, widths of the first metal layer and the second metal layer gradually increase from the tops to the bottoms; and a width of the first metal layer is different from a width of the second metal layer.

Optionally, the width of the second metal layer is greater than the width of the first metal layer.

Optionally, the width of the top of the second metal layer is the same as the width of the top of the first metal layer.

Optionally, the width of the second metal layer is greater than a width of the insulation layer covering the first metal layer.

Optionally, a side of the second metal layer is step-shaped.

Optionally, the width of the first metal layer is greater than the width of the second metal layer.

Optionally, a difference between the width of the first metal layer and the width of the second metal layer is less than or equal to 100 microns.

Optionally, a thickness of the passivation protective layer is greater than 3000 angstroms.

Compared with a structure that the widths of the first metal layer and the second metal layer are the same, in this application, the width of the first metal layer and the width of the second metal layer are made different, so that the side of the second metal layer tends to be flat, and in this case, the passivation protective layer can cover more thickness, thereby improving corrosion resistance.

BRIEF DESCRIPTION OF DRAWINGS

The accompanying drawings included are used to provide an understanding of the embodiments of this application. The accompanying drawings constitute a part of the specification, illustrate examples of implementations of this application, and explain the principle of this application together with the text description. Obviously, the accompanying drawings in the following description are merely some embodiments of this application. For persons of ordinary skill in the art, the persons may obtain other drawings according to these accompanying drawings without creative effects. In the figures.

DETAILED DESCRIPTION

Specific structures and functional details disclosed herein are merely representative, and are intended to describe the objectives of the exemplary embodiments of this application. However, this application may be specifically implemented in many alternative forms, and should not be construed as being limited to the embodiments set forth herein.

In the description of this application, it should be understood that orientation or position relationships indicated by the terms such as "center", "transverse", "on", "below", "left", "right", "vertical", "horizontal", "top", "bottom", "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of this application. In addition, the terms such as "first" and "second" are used only for the purpose of description, and should not be understood as indicating or implying the relative importance or implicitly specifying the number of the indicated technical features. Therefore, a feature defined by "first" or "second" can explicitly or implicitly include one or more of said features. In the description of this application, unless otherwise stated, "a plurality of" means two or more than two. In addition, the terms "include", "comprise" and any variant thereof are intended to cover non-exclusive inclusion.

In the description of this application, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. Persons of ordinary skill in the art may understand the specific meanings of the foregoing terms in this application according to specific situations.

The terminology used herein is for the purpose of describing specific embodiments only and is not intended to be limiting of exemplary embodiments. As used herein, the singular forms "a", "an" and "the" are intended to include the plural forms as well, unless the context clearly indicates otherwise. It should be further understood that the terms "include" and/or "comprise" when used in this specification, specify the presence of stated features, integers, steps, operations, elements, and/or components, but do not preclude the presence or addition of one or more other features, integers, steps, operations, elements, components, and/or combinations thereof.

Figure 1:
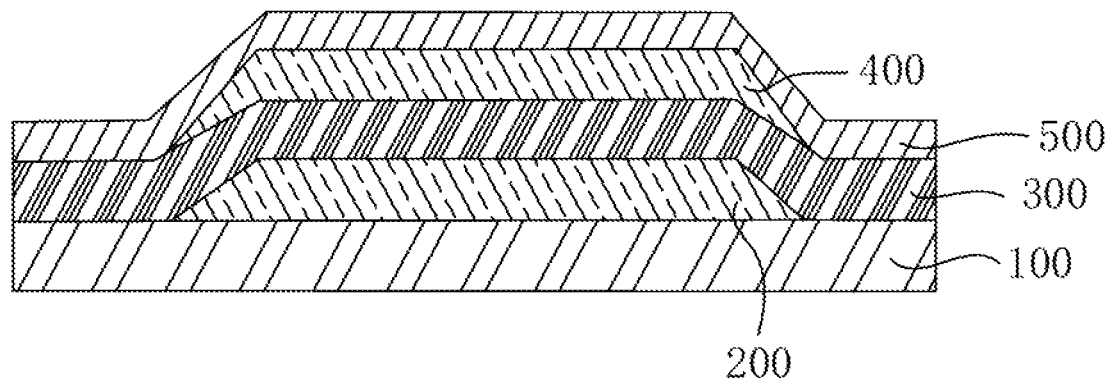
FIG. 1 is a schematic diagram showing that widths of a first metal layer and a second metal layer are the same.

Referring to FIG. 1, generally, in a product design, peripheral cables of an array substrate on a first metal layer and a second metal layer are trimmed, and thus, a passivation protective layer may be thin on a side surface. The thin layer is easily eroded by humid to cause metal corrosion, causing problem to product reliability.

This application is described below with reference to the accompanying drawings and optional embodiments.

Referring to FIG. 3 to FIG. 9, an embodiment of this application discloses a display panel. The display panel includes a substrate 100, a first metal layer 200 is formed on the substrate 100, an insulation layer 300 is formed on the first metal layer 200, a second metal layer 400 is formed on the insulation layer 300, and a passivation protective layer 500 is formed on the second metal layer 400; widths of bottoms of the first metal layer 200 and the second metal layer 400 are greater than widths of tops, widths of the first metal layer 200 and the second metal layer 400 gradually increase from the tops to the bottoms; and a width of the first metal layer 200 is different from a width of the second metal layer 400.

In this solution, the width of the first metal layer 200 and the width of the second metal layer 400 are made different, so that a side of the second metal layer 400 tends to be flat which helps reduce a climbing angle when the passivation protective layer 500 covers the metal layer, and in this case, the passivation protective layer 500 can cover more thickness, thereby improving corrosion resistance and increasing production yields.

In an embodiment, the width of the second metal layer 400 is greater than the width of the first metal layer 200.

In this solution, because the second metal layer 400 is in direct contact with the passivation protective layer 500, and the width of the second metal layer 400 is greater than the width of the first metal layer 200, when the passivation protective layer 500 covers the metal layer, a thickness of the passivation protective layer 500 can be increased only by reducing the angle of the side of the second metal layer 400, thereby increase a bonding degree and avoiding corrosion of the second metal layer 400.

Figure 2:
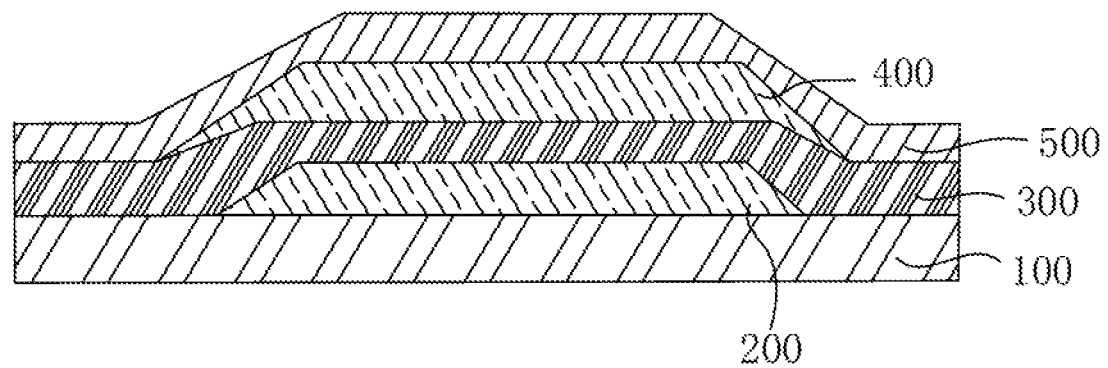
FIG. 2 is a schematic diagram of a display panel according to an embodiment of this application.

Referring to FIG. 2, in an embodiment, the widths of the tops of the second metal layer and the first metal layer are the same.

In this solution, when the second metal layer 400 is formed, an effect that the side of the second metal layer 400 tends to be flat can be achieved by maintaining the widths of the tops of the first metal layer 200 and the second metal layer 400 unchanged and increasing the width of the bottom of the second metal layer 400, and materials of the second metal layer 400 to be used are saved.

Figure 3:
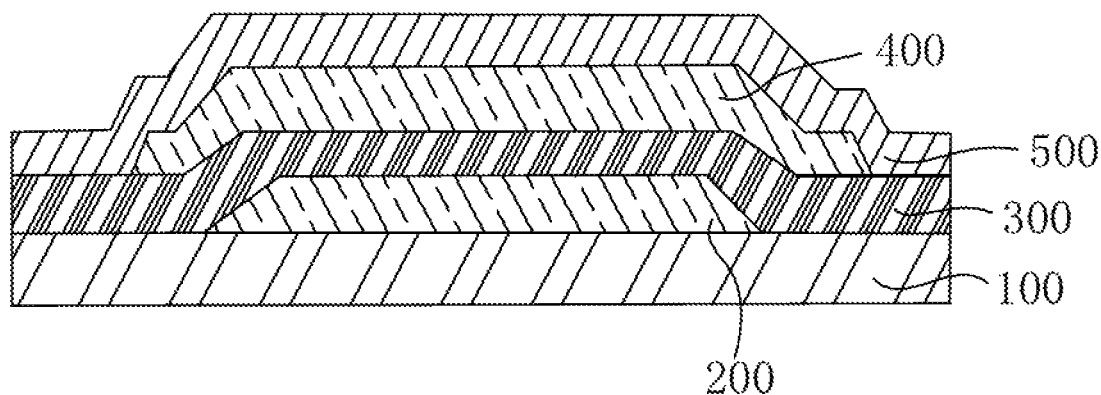
FIG. 3 is a schematic diagram of a display panel according to an embodiment of this application.

Referring to FIG. 3, in an embodiment, the width of the second metal layer 400 is greater than a width of the insulation layer 300 covering the first metal layer 200.

In this solution, the width of the second metal layer 400 is greater than the width of the insulation layer 300 covering the first metal layer 200, so that the second metal layer 400 can cover a side of the insulation layer 300, and when the passivation protective layer 500 covers the metal layer, a climbing angle of the passivation protective layer 500 can be reduced provided that a pitch of the second metal layer 400 is covered.

In an embodiment, the side of the second metal layer 400 is step-shaped.

In this solution, generally, corrosion easily occurs in the area of an edge at which the passivation protective layer 500 is in contact with the second metal layer, and therefore, the edge of the second metal layer 400 is set to step-shaped, so that a climbing angle of the passivation protective layer 500 can be reduced, a contact area of the edge at which the passivation protective layer 500 is in contact with the second metal layer 400 is increased, and a bonding degree is increased, thereby avoiding tilting of the passivation protective layer 500 which causes corrosion of the second metal layer 400.

Figure 4:
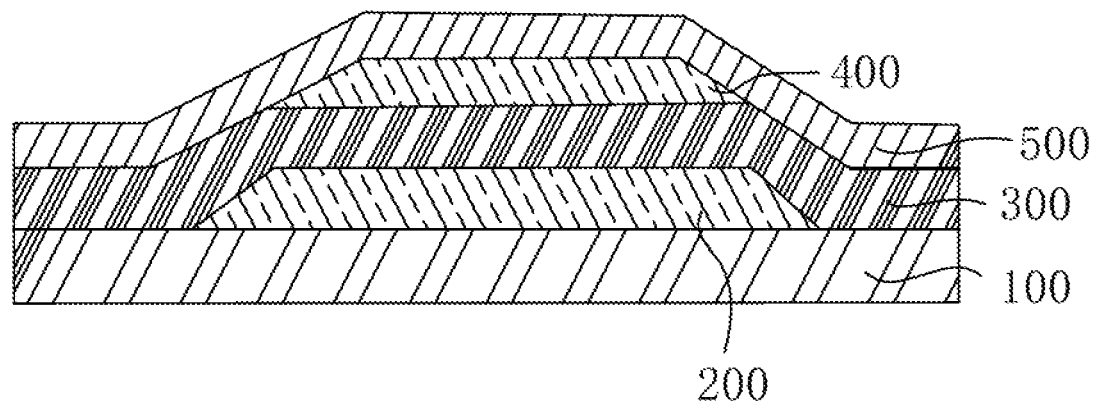
FIG. 4 is a schematic diagram of a display panel according to an embodiment of this application.

Referring to FIG. 4, in an embodiment, the width of the first metal layer 200 is greater than the width of the second metal layer 400.

In this solution, the first metal layer 200 is arranged below the insulation layer 300, and the width of the first metal layer 200 is greater than the width of the second metal layer 400, so that an angle of a position at which the insulation layer 300 is in contact with the second metal layer 400 can be reduced, the second metal layer 400 and the insulation layer 300 tend to be flat, a thickness of the passivation protective layer 500 is increased, and corrosion resistance is improved.

In an embodiment, a difference between the width of the first metal layer 200 and the width of the second metal layer 400 is less than or equal to 100 microns.

In this solution, in consideration of process matching, generally, the difference between the width of the first metal layer 200 and the width of the second metal layer 400 is small and maintained within 100 μm. Because the first metal layer 200 and the second metal layer 400 use grid-shaped cabling, a large difference causes a short-circuit problem.

Figure 5:
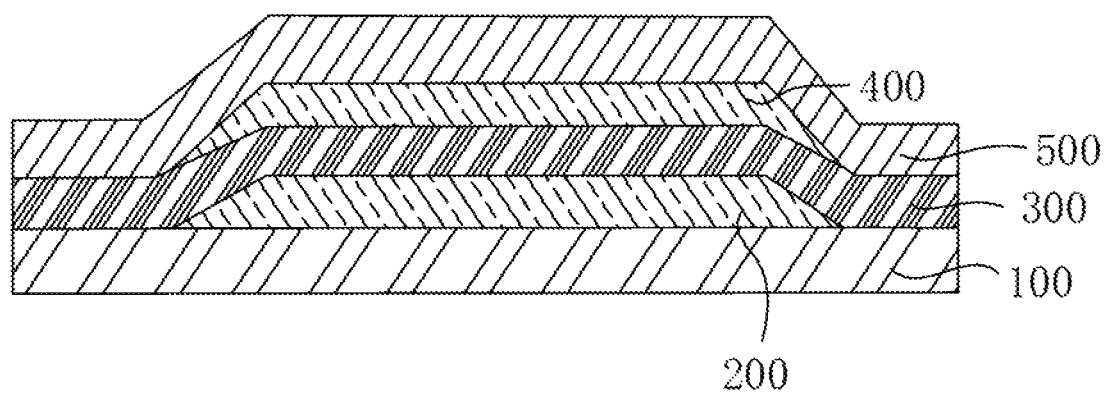
FIG. 5 is a schematic diagram of a display panel according to an embodiment of this application.

Referring to FIG. 5, in an embodiment, the thickness of the passivation protective layer 500 is greater than 3000 angstroms.

In this solution, when the passivation protective layer 500 is plated, material usage of the passivation protective layer 500 is directly increased, so that the thickness of the passivation protective layer 500 is greater than 3000 Å, and in this way, the thickness of the passivation protective layer 500 at the side of the second metal layer 400 can also be effectively improved.

In another embodiment of this application, referring to FIG. 4, a display panel is disclosed. The display panel includes a substrate 100, a first metal layer 200 is formed on the substrate 100, an insulation layer 300 is formed on the first metal layer 200, a second metal layer 400 is formed on the insulation layer 300, and a passivation protective layer 500 is formed on the second metal layer 400; widths of bottoms of the first metal layer 200 and the second metal layer 400 are greater than widths of tops, widths of the first metal layer 200 and the second metal layer 400 gradually increase from the tops to the bottoms, and a width of the first metal layer 200 is different from a width of the second metal layer 400. The width of the second metal layer 400 is greater than the width of the first metal layer 200. The width of the second metal layer 400 is greater than a width of the insulation layer 300 covering the first metal layer 200. A side of the second metal layer 400 is step-shaped. A difference between the width of the second metal layer 400 and the width of the first metal layer 200 is less than or equal to 100 microns.

The width of the first metal layer 200 and the width of the second metal layer 400 are made different, so that a side of the second metal layer 400 tends to be flat which helps reduce a climbing angle when the passivation protective layer 500 covers the metal layer, and in this case, the passivation protective layer 500 can cover more thickness, thereby improving corrosion resistance and increasing production yields. Because the second metal layer 400 is in direct contact with the passivation protective layer 500, and the width of the second metal layer 400 is greater than the width of the first metal layer 200, when the passivation protective layer 500 covers the metal layer, a thickness of the passivation protective layer 500 can be increased only by reducing the angle of the side of the second metal layer 400, thereby increase a bonding degree and avoiding corrosion of the second metal layer 400. The width of the second metal layer 400 is greater than the width of the insulation layer 300 covering the first metal layer 200, so that the second metal layer 400 can cover a side of the insulation layer 300, and when the passivation protective layer 500 covers the metal layer, a climbing angle of the passivation protective layer 500 can be reduced provided that a pitch of the second metal layer 400 is covered. Generally, corrosion easily occurs in the area of an edge at which the passivation protective layer 500 is in contact with the second metal layer, and therefore, the edge of the second metal layer 400 is set to step-shaped, so that a climbing angle of the passivation protective layer 500 can be reduced, a contact area of the edge at which the passivation protective layer 500 is in contact with the second metal layer 400 can be increased, and a bonding degree is increased, thereby avoiding tilting of the passivation protective layer 500 which causes corrosion of the second metal layer 400. In consideration of process matching, generally, the difference between the width of the first metal layer 200 and the width of the second metal layer 400 is small and maintained within 100 μm. Because the first metal layer 200 and the second metal layer 400 use grid-shaped cabling, a large difference causes a short-circuit problem.

In another embodiment of this application, referring to FIG. 2 to FIG. 5, this application further discloses a display device, including the display panel according to any one of the foregoing embodiments.

The technical solution of this application can be widely applied to various display panels, such as a TN display panel (full name: Twisted Nematic, that is, a twisted nematic panel), an In-Plane Switching display panel (IPS panel), a Vertical Alignment (VA) display panel, a Multi-domain Vertical Alignment (MVA) display panel (multi-domain vertical alignment technology), and the display panel may be a panel of another type certainly, such as an OLED display panel, provided that the display panel is applicable.

The foregoing contents are detailed descriptions of this application in conjunction with specific optional embodiments, and it should not be considered that the specific implementation of this application is limited to these descriptions. Persons of ordinary skill in the art can further make simple deductions or replacements without departing from the concept of this application, and such deductions or replacements should all be considered as falling within the protection scope of this application.

What is claimed is:

1. A display panel, comprising:
   a substrate, wherein
   a first metal layer is formed on the substrate, an insulation layer is formed on the first metal layer, a second metal layer is formed on the insulation layer, and a passivation protective layer is formed on the second metal layer and configured to protect the second metal layer from humidity; a width of a bottom of each of the first metal layer and the second metal layer is greater than a width of a top thereof, widths of each of the first metal layer and the second metal layer gradually increase from the top to the bottom; and a width of the first metal layer is different from a width of the second metal layer;
   wherein each of both sides of a cross-section of the second metal layer taken along a width of the second metal layer has a gentler slope with respect to a surface of the substrate than the corresponding side of a cross-section of the first metal layer taken along a width of the first metal layer.

2. The display panel according to claim 1, wherein the width of the second metal layer is greater than the width of the first metal layer.

3. The display panel according to claim 2, wherein the width of the top of the second metal layer is equal to the width of the top of the first metal layer.

4. The display panel according to claim 2, wherein the width of the second metal layer is greater than a width of the insulation layer covering the first metal layer.

5. The display panel according to claim 4, wherein each of both sides of the second metal layer is step-shaped, wherein each side comprises two sloping portions and a flat stepped portion connected in between.

6. The display panel according to claim 1, wherein the width of the first metal layer is greater than the width of the second metal layer.

7. The display panel according to claim 1, wherein a difference between the width of the first metal layer and the width of the second metal layer is less than or equal to 100 microns.

8. The display panel according to claim 1, wherein a thickness of the passivation protective layer is greater than 3000 angstroms.

9. A display panel, comprising:
a substrate, wherein
a first metal layer is formed on the substrate, an insulation layer is formed on the first metal layer, a second metal layer is formed on the insulation layer, and a passivation protective layer is formed on the second metal layer; a width of a bottom of each of the first metal layer and the second metal layer is greater than a width of a top thereof, widths of each of the first metal layer and the second metal layer gradually increase from the top to the bottom; and a width of the first metal layer is different from a width of the second metal layer;
the width of the second metal layer is greater than the width of the first metal layer;
the width of the second metal layer is greater than a width of the insulation layer covering the first metal layer; and
wherein each of both sides of the second metal layer is step-shaped, wherein each side comprises two slopping portions and a flat stepped portion connected in between;
wherein the first metal layer and the second metal layer constitute a double-layer wire structure that is disposed in an edge area of the display panel and that is configured to transmit a same signal simultaneously through both the first metal layer and the second metal layer;
wherein a length of the first metal layer and a length of the second metal layer run parallel to each other.

10. A display device, comprising a display panel, comprising:
a substrate, wherein
a first metal layer is formed on the substrate, an insulation layer is formed on the first metal layer, a second metal layer is formed on the insulation layer, and a passivation protective layer is formed on the second metal layer: a width of a bottom of each of the first metal layer and the second metal layer is greater than a width of a top thereof, widths of each of the first metal layer and the second metal layer gradually increase from the top to the bottom; and a width of the first metal layer is different from a width of the second metal layer;
wherein each of both sides of a cross-section of the second metal layer taken along a width of the second metal layer has a gentler slope with respect to a surface of the substrate than the corresponding side of a cross-section of the first metal layer taken along a width of the first metal layer.

11. The display device according to claim 10, wherein the width of the second metal layer is greater than the width of the first metal layer.

12. The display device according to claim 11, wherein the width of the top of the second metal layer is equal to the width of the top of the first metal layer.

13. The display device according to claim 11, wherein the width of the second metal layer is greater than a width of the insulation layer covering the first metal layer.

14. The display device according to claim 13, wherein each of both sides of the second metal layer is step-shaped, wherein each side comprises two sloping portions and a flat stepped portion connected in between.

15. The display device according to claim 10, wherein the width of the first metal layer is greater than the width of the second metal layer.

16. The display device according to claim 10, wherein a difference between the width of the first metal layer and the width of the second metal layer is less than or equal to 100 microns.

17. The display device according to claim 10, wherein a thickness of the passivation protective layer is greater than 3000 angstroms.

18. The display panel according to claim 6, wherein a cross-section of each of the first metal layer and the second metal layer taken along a width thereof is a trapezoid, and wherein each base angle of the trapezoid-shaped cross-section of the second metal layer is smaller than a corresponding base angle on the same side of the trapezoid-shaped cross-section of the first metal layer, and wherein each of both sides of the trapezoid-shaped cross-section of the second metal layer is coplanar with a corresponding sloping side of the insulation layer.

19. The display panel according to claim 1, wherein the first metal layer and the second metal layer constitute a double-layer wire structure that is disposed in an edge area of the display panel and that is configured to transmit a same signal simultaneously through both the first metal layer and the second metal layer.

20. The display panel according to claim 1, wherein a length of the first metal layer and a length of the second metal layer run parallel to each other.

* * * * *